United States Patent
Wang et al.

(10) Patent No.: US 12,041,252 B2
(45) Date of Patent: Jul. 16, 2024

(54) MULTI-THREADED CABAC DECODING

(71) Applicant: Sony Interactive Entertainment Inc., Tokyo (JP)

(72) Inventors: Jason Wang, Palo Alto, CA (US); Manoj Srivastava, Redwood City, CA (US)

(73) Assignee: Sony Interactive Entertainment Inc., Tokyo (JP)

( * ) Notice: Subject to any disclaimer, the term of this patent is extended or adjusted under 35 U.S.C. 154(b) by 234 days.

(21) Appl. No.: 17/341,233

(22) Filed: Jun. 7, 2021

(65) Prior Publication Data

US 2022/0394284 A1 Dec. 8, 2022

(51) Int. Cl.
*H04N 19/44* (2014.01)
*H04N 19/13* (2014.01)
*H04N 19/169* (2014.01)
*H04N 19/70* (2014.01)

(52) U.S. Cl.
CPC ............. *H04N 19/44* (2014.11); *H04N 19/13* (2014.11); *H04N 19/169* (2014.11); *H04N 19/70* (2014.11)

(58) Field of Classification Search
CPC ...... H04N 19/44; H04N 19/13; H04N 19/169; H04N 19/70
See application file for complete search history.

(56) References Cited

U.S. PATENT DOCUMENTS

| | | | | |
|---|---|---|---|---|
| 8,553,876 | B1* | 10/2013 | Spracklen | G06F 21/72 380/28 |
| 9,311,721 | B1* | 4/2016 | Loughry | G06T 1/20 |
| 10,838,843 | B1* | 11/2020 | Narasimha | G06F 16/901 |
| 11,119,921 | B1* | 9/2021 | Hegde | G06F 5/16 |
| 2006/0256854 | A1* | 11/2006 | Jiang | H04N 19/61 375/240.03 |
| 2014/0233652 | A1* | 8/2014 | Zhao | H04N 19/513 375/240.16 |
| 2014/0282368 | A1* | 9/2014 | Howard | G06F 8/20 717/105 |
| 2015/0117536 | A1* | 4/2015 | Yu | H04N 19/436 375/240.16 |
| 2015/0169303 | A1* | 6/2015 | Zhao | G06F 8/443 717/160 |
| 2016/0353110 | A1* | 12/2016 | Zhang | H04N 19/126 |
| 2018/0091815 | A1* | 3/2018 | Banerjee | H04N 19/436 |

(Continued)

OTHER PUBLICATIONS

Han, Jingning et al. "A Technical Overview of AV1" Proceedings of the IEEE, DOI 10.1109/JPROC.2021.3058584 Published Feb. 1, 2021.

Marpe, Detlev et al. "Context-Based Adaptive Binary Arithmetic Coding in the H.264/AVC Video Compression Standard" IEEE Trans. on Circuits and Systems for Video Tech. vol. 13, No. 7, Jul. 2003.

(Continued)

*Primary Examiner* — Joseph Suh
(74) *Attorney, Agent, or Firm* — JDI PATENT; Joshua D. Isenberg; Robert Pullman

(57) ABSTRACT

A method, system, and computer readable medium for improved decoding CABAC encoded media are described. A decoding loop includes decoding an encoded binary element from a sequence of encoded binary elements to generate a decoded binary element using a context probability. A next context probability for a next encoded binary element in the sequence is determined from the decoded binary element and the next context probability for decoding the next encoded binary element is provided to the decoding loop for a next iteration.

22 Claims, 6 Drawing Sheets

(56) References Cited

U.S. PATENT DOCUMENTS

| | | | |
|---|---|---|---|
| 2018/0262770 A1 | 9/2018 | Budagavi et al. | |
| 2018/0276051 A1* | 9/2018 | Wen | G06F 9/30036 |
| 2019/0041823 A1* | 2/2019 | Yan | G05B 19/054 |
| 2019/0087986 A1* | 3/2019 | Spohn | G06T 11/005 |
| 2019/0286479 A1* | 9/2019 | Tian | G06F 9/455 |
| 2020/0267098 A1* | 8/2020 | Galles | H04L 47/263 |
| 2020/0304800 A1* | 9/2020 | Takano | H04N 19/436 |
| 2021/0004278 A1* | 1/2021 | Nishi | G06F 9/524 |
| 2021/0056348 A1* | 2/2021 | Berlin | G06V 10/764 |
| 2021/0120247 A1 | 4/2021 | Galpin et al. | |
| 2021/0185153 A1* | 6/2021 | Kittner | H04L 69/22 |
| 2021/0211139 A1* | 7/2021 | Gopal | H03M 7/40 |
| 2021/0344549 A1* | 11/2021 | Babington | H03M 7/6011 |

OTHER PUBLICATIONS

Mukherjee, Debargha et al. "A Technical Overview of VP9: The latest royalty-free video codec from Google" available at:https://files.meetup.com/9842252/Overview-VP9.pdf, accessed: Mar. 3, 2021.
Richardson, Iain E. G. "H.264/MPEG-4 Part 10 White Paper" H.264/MPEG-4 Part 10: Introduction to CABAC, www.vcodex.com, Oct. 17, 2002.
Watanabe, Kenji et al. "A High-speed H.264/AVC Cabac Decoder for 4K Video Utilizing Residual Data Accelerator" SASIMI 2012 Proceedings p. 7-10 (2012).
International Search Report and Written Opinion dated Sep. 1, 2022 for International Patent Application No. PCT/US2022/026204.

* cited by examiner

MULTI-THREADED CABAC DECODING

FIELD OF THE DISCLOSURE

Aspects of the present disclosure relate to decoding of encoded media. Specifically aspects of the present disclosure relate to improved Context-Adaptive Binary Arithmetic Coding (CABAC) decoding.

BACKGROUND OF THE DISCLOSURE

As shown in FIG. 1, the Prior art CABAC decoding is a tight loop. For each binary decision (bin) to be decoded 101, the CABAC decoding engine 102 must find out the probability from a probability table 107 of the bin being a zero or a one. As the name Context Adaptive Binary Arithmetic Coding implies, the probability depends on the context 106 of this bin. Using the VP9 decoder as an example, if all DCT coefficients, which are represented by the same integer bit-depth, the probability of a 0 or 1 at each bit position is the same without context. For example, the most significant bit of all same bit-depth integers shares the same probability. To resolve the true probability of the DCT coefficient the context must be determined.

To find the correct context of a bin 106, the decoder must run a syntax parser 104 to parse all previously decoded bins 103 and determine the decoded symbol 105. For example, if the syntax parser finds that the current coefficient bit-depth is 5 (4 value bits and 1 sign bit) and finds that it has decoded 4 bins for this coefficient. Then the syntax parser will determine that the next bin will represent the sign bit of this coefficient as the parser has determined that the 4 bits are a coefficient. By knowing this information, the CABAC engine can pick a correct probability to decode the sign bit bin. The CABAC engine always waits for the syntax parser to complete the last bin parsing before decoding the next bin. This creates a data dependency at bin level.

Modern general-purpose processors have multiple processor cores and each processor core has multiple computational units. Multiple processor cores can utilize thread level parallelism and multiple computational units can utilize instruction level parallelism. However, because CABAC bin decoding is a tight loop, running a single loop on multiple threads will introduce big inter-thread communication delay per loop iteration. Because CABAC algorithm creates data dependencies at bin level, it also lacks instruction level parallelism for multiple computational units. As the result, the CABAC decoding loop cannot utilize multiple processor cores and multiple computational units per core. Consequently, CABAC decoding performance with general-purpose processors tends to be poor.

CABAC entropy coding is popular with video compression standards, such as AVC (H.264), HEVC (H.265), VVC (H.266), VP9, and AV1. Currently, only dedicated hardware decoders can decode unconstrained CABAC streams at >100 Mbps in real time. A single consumer grade processor core is not fast enough to decode such streams. The only feasible approach to enable real time decoding with high bitrate by existing general-purpose processors is parallel decoding. Unfortunately, there is no suitable parallel decoding for CABAC streams. Video coding standards introduced multiple coding tools or constraints to enable parallel decoding, such as multiple slices, multiple tiles, and wavefronts. However, these tools or constraints may slightly decrease the coding efficiency and not all encoders support these coding tools or accept the constraints. Optimally a decoder should not assume that all input streams have such tools or constraints.

It is within this context that aspects of the present disclosure arise.

BRIEF DESCRIPTION OF THE DRAWINGS

The teachings of the present disclosure can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Aspects of the present disclosure enable parallel CABAC decoding independent from video standards introduced parallel decoding tools and constraints. Implementations of parallel CABAC may utilize the computational power of multiple CPU cores or CPU/GPU to decode high bitrate unconstrained CABAC stream in real time. Existing parallelization solutions divide the task of decoding a picture at the slice, row or tile level using information from the encoder defined by the encoder standard to determine split locations for parallelization. Some video encoding standards lack information from the encoder for splitting the picture for parallel decoding and therefore parallelization is not possible. Additionally, the information for dividing the picture for parallel decoding requires additional data to be encoded with the pictures. Consequently, there is a coding efficiency drop when frames are encoded with information for dividing pictures. Aspects of the present disclosure provide a method to enable parallel CABAC decoding with video standards that lack information for splitting pictures.

Before describing the improved method of parallelization of CABAC decoding, it is useful to understand how digital pictures, e.g., video pictures are encoded/decoded for streaming applications and storage applications. In the context of aspects of the present disclosure, video picture data may be broken down in suitable sized units for coding and decoding. For example, in the case of video data, the video data may be broken down into pictures with each picture representing a particular image in a series of images. Each unit of video data may be broken down into sub-units of varying size. Generally, within each unit there is some smallest or fundamental sub-unit. In the case of video data, each video frame may be broken down into pixels, each of which contains luma (brightness) and chroma (color) data.

Figure 5:
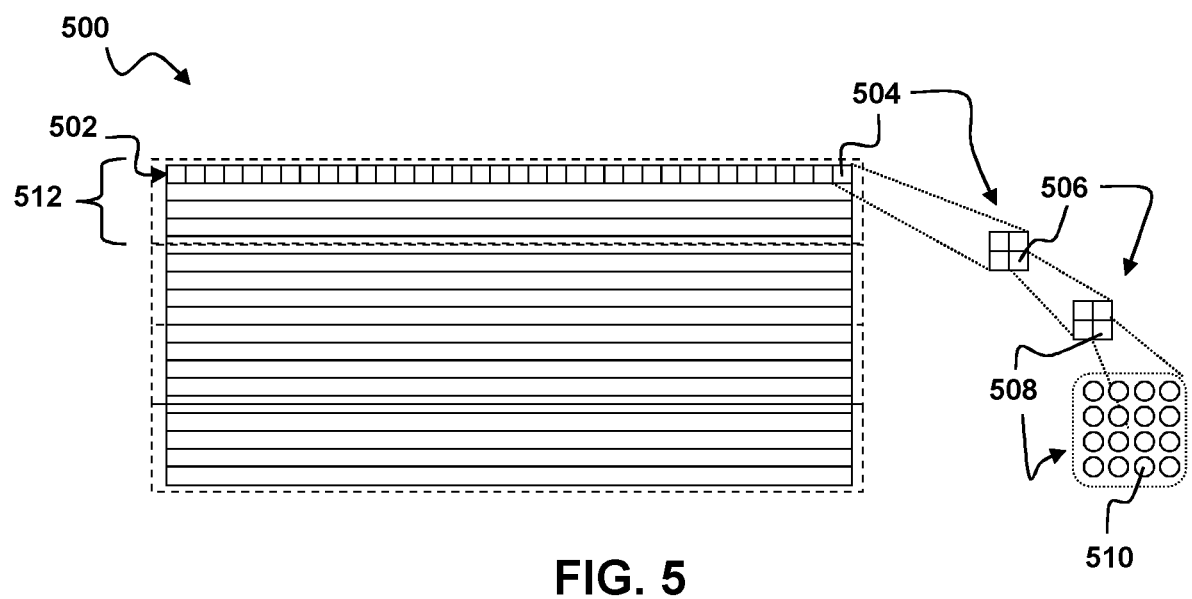
FIG. 5 is a schematic diagram illustrating one possible division of a streaming data picture within the context of aspects of the present disclosure.

By way of example, and not by way of limitation, as shown in FIG. 5, a single picture 500 (e.g., a digital video frame) may be broken down into one or more sections. As used herein, the term "section" can refer to a group of one or more luma or chroma samples within the picture 500. A section can range from a single luma or chroma sample within the picture, up to the whole picture. Non-limiting examples of sections include slices (e.g., macroblock rows) 502, macroblocks 504, sub-macroblocks 506, blocks 508 and individual pixels 510. As illustrated in FIG. 5, each slice 502 contains one or more rows of macroblocks 504 or portions of one or more such rows. The number of macroblocks in a row depends on the size of the macroblocks and the size and resolution of the picture 500. For example, if each macroblock contains sixteen by sixteen chroma or luma samples then the number of macroblocks in each row may be determined by dividing the width of the picture 500 (in chroma or luma samples) by sixteen. Each macroblock 504 may be broken down into a number of sub-macroblocks 506. Each sub-macroblock 506 may be broken down into a number of blocks 508 and each block may contain a number of chroma or luma samples 510. By way of example, and without limitation, in a common video coding scheme, each macroblock 504 may be broken down into four sub-macroblocks 506. Each sub-macroblock may be broken down into four blocks 508 and each block may contain a four by four arrangement of sixteen chroma or luma samples 510.

Some codecs, such as H.265, allow a given picture to be broken down into two or more sections of different sizes for encoding. In particular, the H.265 standard introduces the "tile" concept of partitioning a picture. Tiles are independently decodable regions of a picture that are encoded with some shared header information. Tiles can additionally be used for the purpose of spatial random access to local regions of video pictures. A typical tile configuration of a picture consists of segmenting the picture into rectangular regions with approximately equal numbers of coding units (CUs) in each tile. A coding unit is analogous to a macroblock (MB) in the H.264 standard. However, the size of the CU can be set by the encoder, and can be larger than a macroblock. The size of the CU can be flexible and adaptive to video content for best partitioning of the picture.

It is noted that each picture may be either a frame or a field. A frame refers to a complete image. A field is a portion of an image used for to facilitate displaying the image on certain types of display devices. Generally, the chroma or luma samples in an image are arranged in rows. To facilitate display an image may sometimes be split by putting alternate rows of pixels into two different fields. The rows of chroma or luma samples in the two fields can then be interlaced to form the complete image. For some display devices, such as cathode ray tube (CRT) displays, the two fields may simply be displayed one after the other in rapid succession. The afterglow of the phosphors or other light emitting elements used to illuminate the pixels in the display combined with the persistence of vision results in the two fields being perceived as a continuous image. For certain display devices, such as liquid crystal displays, it may be necessary to interlace the two fields into a single picture before being displayed. Streaming data representing encoded images may include information indicating whether the image is a field or a frame or in some standards, such information may be absent. Such information may be included in a header to the image.

Modern video coder/decoders (codecs), such as MPEG2, MPEG4 and H.264 generally encode video frames as one of three basic types known as Intra-Frames, Predictive Frames and Bipredicitve Frames, which are typically referred to as I-frames, P-frames and B-frames respectively.

An I-frame is a picture coded without reference to any picture except itself. I-frames are used for random access and are used as references for the decoding of other P-frames or B-frames. I-frames may be generated by an encoder to create random access points (to allow a decoder to start decoding properly from scratch at a given picture location). I-frames may be generated when differentiating image details prohibit generation of effective P or B frames. Because an I-frame contains a complete picture, I-frames typically require more bits to encode than P-frames or B-frames. Video frames are often encoded as I-frames when a scene change is detected in the input video.

P-frames require the prior decoding of some other picture(s) in order to be decoded. P-frames typically require fewer bits for encoding than I-frames. A P-frame contains encoded information regarding differences relative to a previous I-frame in decoding order. A P-frame typically references the preceding I-frame in a Group of Pictures (GoP). P-frames may contain both image data and motion vector displacements and combinations of the two. In some standard codecs (such as MPEG-2), P-frames use only one previously-decoded picture as a reference during decoding, and require that picture to also precede the P-frame in display order. In H.264, P-frames can use multiple previously-decoded pictures as references during decoding, and can have any arbitrary display-order relationship relative to the picture(s) used for its prediction.

B-frames require the prior decoding of either an I-frame or a P-frame in order to be decoded. Like P-frames, B-frames may contain both image data and motion vector displacements and/or combinations of the two. B-frames may include some prediction modes that form a prediction of a motion region (e.g., a segment of a frame such as a macroblock or a smaller area) by averaging the predictions obtained using two different previously-decoded reference regions. In some codecs (such as MPEG-2), B-frames are never used as references for the prediction of other pictures. As a result, a lower quality encoding (resulting in the use of fewer bits than would otherwise be used) can be used for such B pictures because the loss of detail will not harm the prediction quality for subsequent pictures. In other codecs, such as H.264, B-frames may or may not be used as references for the decoding of other pictures (at the discretion of the encoder). Some codecs (such as MPEG-2), use exactly two previously-decoded pictures as references during decoding, and require one of those pictures to precede the B-frame picture in display order and the other one to follow it. In other codecs, such as H.264, a B-frame can use one, two, or more than two previously-decoded pictures as references during decoding, and can have any arbitrary display-order relationship relative to the picture(s) used for its prediction. B-frames typically require fewer bits for encoding than either I-frames or P-frames.

As used herein, the terms I-frame, B-frame and P-frame may be applied to any streaming data units that have similar properties to I-frames, B-frames and P-frames, e.g., as described above with respect to the context of streaming video.

For encoding digital video pictures, an encoder receives a plurality of digital images and encodes each image. Encoding of the digital picture may proceed on a section-by-section basis. As used herein, image compression refers to the application of data compression to digital images. The objective of the image compression is to reduce redundancy of the image data for a given image in order to be able to store or transmit the data for that image in an efficient form of compressed data.

Entropy encoding is a coding scheme that assigns codes to signals to match code lengths with the probabilities of the signals. Typically, entropy encoders are used to compress data by replacing symbols represented by equal-length codes with symbols represented by codes proportional to the negative logarithm of the probability.

CABAC is a form of entropy encoding used in the H.264/MPEG-4 AVC and High Efficiency Video Coding (HEVC) standards. CABAC is notable for providing much better compression than most other entropy encoding algorithms used in video encoding, and it is one of the key elements that provide the H.264/AVC encoding scheme with better compression capability than its predecessors. However, it is noted that CABAC uses arithmetic coding which may require a larger amount of processing to decode than Context Adaptive Variable-Length Coding (CAVLC).

Investigation shows that the following operations are necessary to run CABAC bin decoding. These operations are called, CABAC core operations.
1. Pick a context for the next bin according to all previously decoded bins.
2. Find the probability of the next bin.
3. Decode the next bin.

An insight of this disclosure is that not all syntax parser tasks belong to CABAC core operations. For example, for DCT coefficient decoding, after decoding all 4 value bit bins and 1 sign bit bin, the decoder will reconstruct a signed integer and store it in a DCT coefficient matrix. The process of integer reconstruction and store are not CABAC core operations and could be moved to another thread that is separate from the thread that does the CABAC decoding. CABAC bin decoding is a very tight loop requiring few operations to do arithmetic calculation and table lookup. The syntax parser on the other hand is much larger. Each type of syntax symbol has a dedicated code block to reconstruct.

It has been found that, if a grammar for an encoding system is context-less at the super block or macroblock level, there is a many to one relationship between states and CABAC bin contexts at that level. In other words, a machine state could be used to lookup the context of a CABAC bin on the super block or macroblock level. If symbol reconstruction is removed from the CABAC decoding thread, a finite state machine may be defined to decode all the symbols in a context-less grammar. Removing the syntax reconstruction function of the decoding cycles would allow, at least, all cycle heavy syntax elements to be parsed by the finite state machine. Cycle heavy syntax elements include decoded symbols such as DCT coefficients, motion vectors and bock prediction modes. It should be noted that there are some symbols which are loop dependent and cannot be reconstructed using a state machine, typically these symbols are picture level and may be decoded with the symbol dependent context lookup used in the prior art.

Figure 1:
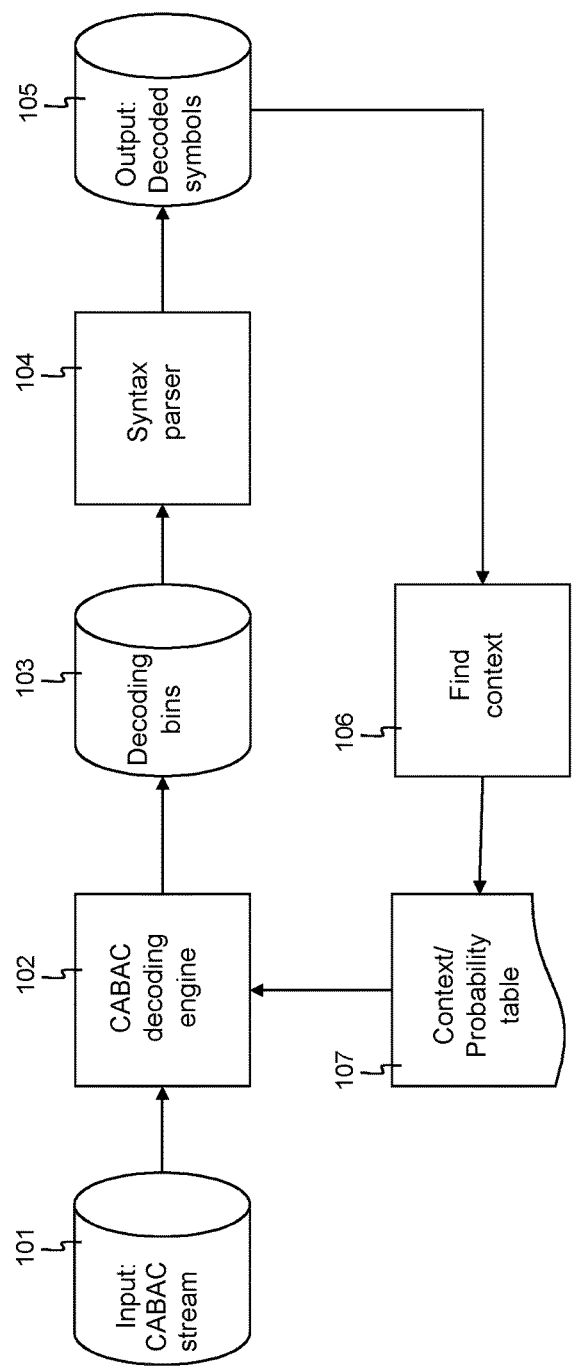
FIG. 1 is a flow diagram of a prior art method for decoding CABAC encoded media.
Figure 2:
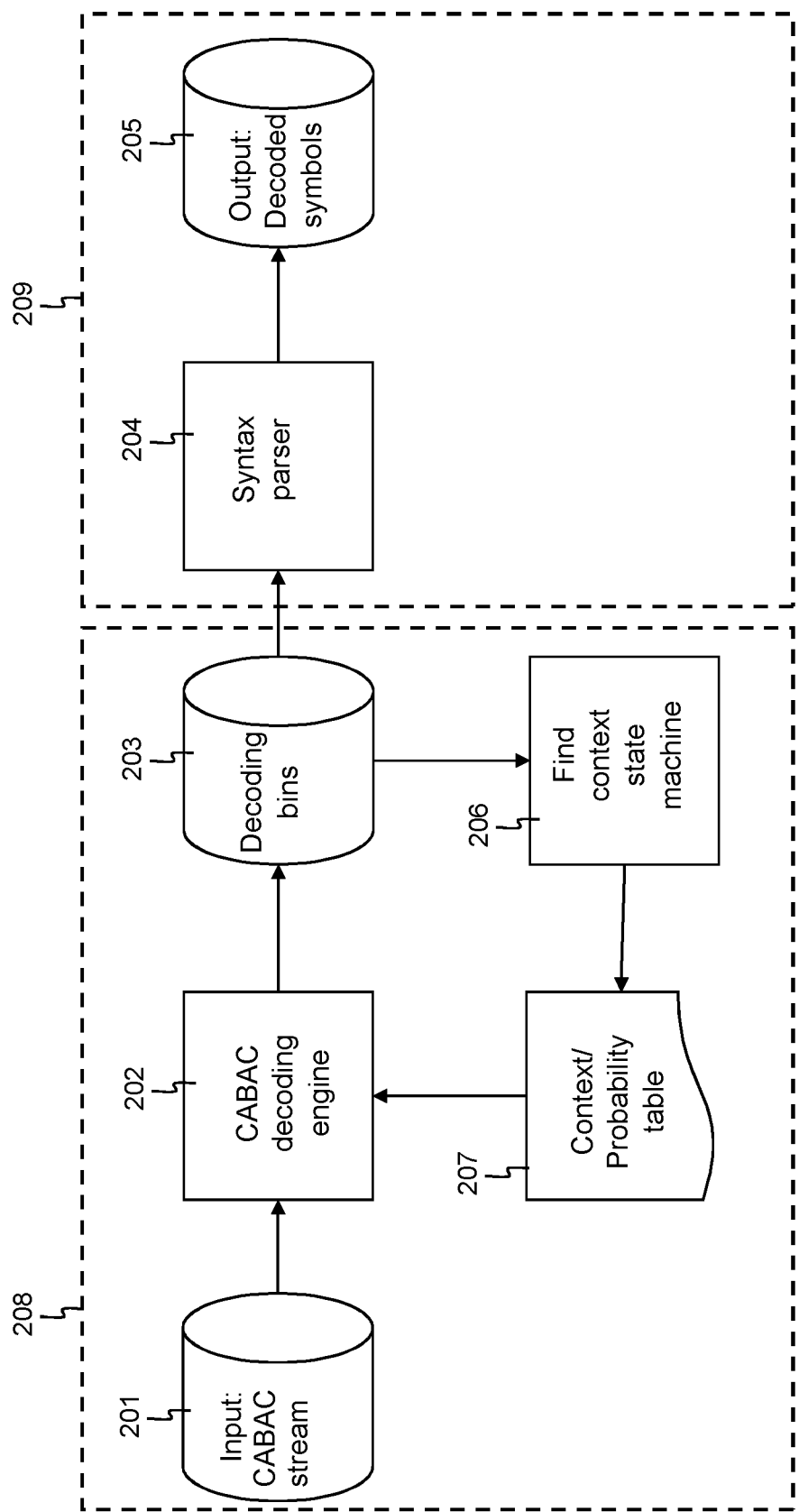
FIG. 2 is a flow diagram of an improved method for decoding CABAC encoded media according to aspects of the present disclosure.

As shown in FIG. 2 the separation between the CABAC engine 208 and the Syntax Parser 209 allows the creation of a loop in the CABAC engine 208 using a decoded binary string (also sometimes referred to as a 'syntax element binarization' or 'bin string') without a complete reconstruction of the symbols 205. The CABAC engine 208 includes receiving a CABAC encoded input stream 201, a CABAC decoding engine 202 which generates a decoded bin string 203, a context state machine 206 which advances in state when the current binary element (also referred to herein as a 'bin') is decoded and provides the context for context probability lookup table 207. The context probability table 207 is used with the state from the state machine 206 and the current decoded binary element 203 to provide the probability that the next binary element will be a 1 or 0 to the CABAC decoding engine 202. As used herein a binary element or bin is a single bit of a bit string. A binary string or bins is a collection of binary elements and is an intermediate representation of a value of a syntax element from the binarization of a syntax element.

Resolving the context probabilities from the decoded binary element 203 and the state of a finite state machine 206 allows for a reduced program size and further allows for parallel processing as dependencies on syntax parsing is eliminated. After moving syntax reconstruction out from CABAC decoding thread, the thread may easily fit into the level-1 instruction cache of a CPU core of an existing multi-core processor. The context probability table 207 may be small enough to be loaded in to the data cache of the CPU. The CABAC engine 208 may operate independently of the syntax parser 209 to decode bins in a tight loop. This further allows varying degrees of parallelism. Multiple instances of the Syntax parser 209 may be run on separate threads of a processor or separate cores of a processor and the CABAC engine 208 may supply bins to the separate cores running the syntax parser 209. In some alternative implementations, the CABAC engine 208 may be implemented on a central processing unit (CPU) and the syntax parser 209 may be implemented on one or more graphics processing units (GPU). In some other alternative embodiments, the CABAC engine 208 may be implemented on a CPU core of a processor and the syntax parser 209 may be implemented on a GPU core of the processor.

The syntax parser 209 may implement syntax parsing operations 204 that translate decoded bin strings 203 from the CABAC engine 208 into decoded symbols 205. The syntax parser includes dedicated code blocks for each type of syntax symbol in the encoding standard that may be run in parallel to decode each symbol separately or for greater parallelism, the syntax parsers 209 may simultaneously decode symbols on the super block, macroblock, or block level. Separating the syntax parser 209 from the CABAC engine 208 allows for parallelization of the syntax parsing operations. Such parallelization may include implementation of parallel threads, which may be run on a single core or on multiple cores or compute units within a core.

Figure 3:
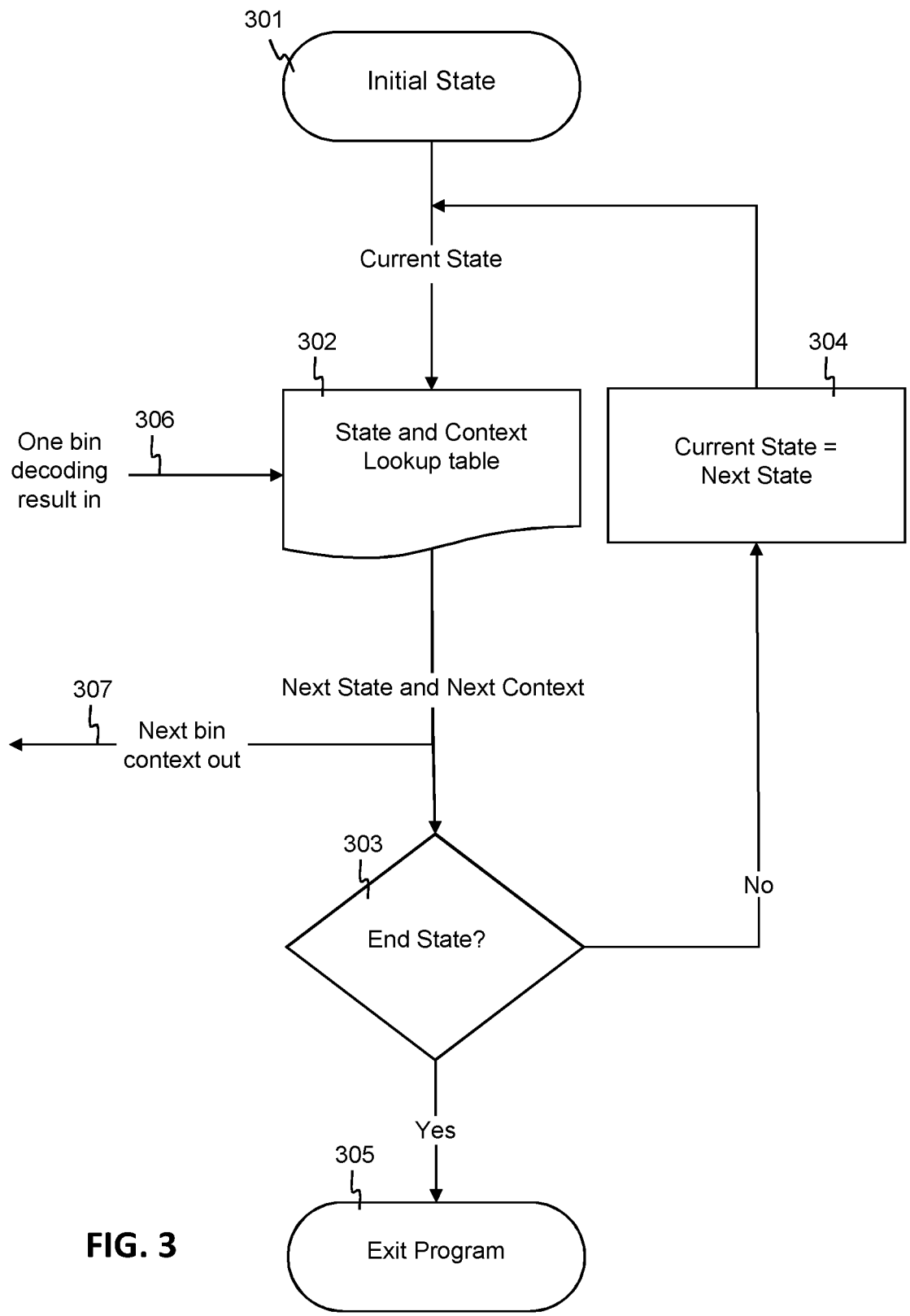
FIG. 3 is a flow diagram of the operation of a state machine in the improved method for decoding CABAC encoded media according to aspects of the present disclosure.

Returning to the CABAC engine 208, FIG. 3 shows an example implementation of the finite state machine according to aspects of the present disclosure. As shown the finite state machine takes an initial state 301 and advances the initial state to a current state. The system uses the current state of the finite state machine with the last decoded bin value 306 (if a previous bin has been decoded) to determine the next state. The next state is used to determine the context probability for the next bin using the lookup table 302. In some implementations, the context state machine 206 may perform two separate lookup operations, the context state machine may include an internal lookup table, which it uses to lookup a context from its state. Using the current context determined from the internal lookup table of the state machine 206, the state machine may then lookup the bin probability from the context probability lookup table 207. Any suitable method may be used to find a bin probability from context. By way of example and not by way of limitation, one method is to define a bin probability as constant for a given context thus each context has a probability in an array. By way of alternative example and not by way of limitation, another method is to have an array of probabilities that is indexed by the context. The CABAC engine may update an entry of the array according to the decoding result of the previous bin with the same context.

Once the context probability is determined it can be provided 307 to the CABAC decoding engine 202 which may use the context probability to determine the next bin value. The input of the CABAC decoding engine 202 is the input CABAC stream 201 and the context-probability determined using the lookup table 302. After providing context probability, the state machine performs a check to determine if the next state is an end state 303. If the next state is not an end state (no) the state machine changes the next state to the current state 304 and continues the loop by taking the bin value 306 and the current state 304 and using the lookup table 302 to determine the next context probabilities and so on.

If the next state is an end state (yes) then the finite state will enter an Exit Program state 305. The CABAC decoding loop outputs a decoded bin string from all of the previously decoded binary elements. For example and without limitation the CABAC decoding loop may output a decoded binary string having two or more previously decoded binary elements. The Exit program state 305 may include an additional entry that indicates the end of a block, macroblock or super block. The end of state entry may include several binaries that indicate the type of symbol and directs the decoded bin string to the proper syntax parser. In some implementations, there are multiple syntax parsers operating in parallel and the end of state entry may be used to direct the decoded bin strings to the proper syntax parser that matches symbols to the corresponding decoded bin strings. Alternatively, the syntax parser may use the end of entry flag to choose the proper syntax parsing operations.

Thus, the method for improved decoding CABAC encoded media may comprise a decoding loop, which may include decoding an encoded binary element from a sequence of encoded binary elements to generate a decoded binary element using a context probability. A next context probability is determined for a next encoded binary element in the sequence from the decoded binary element and provided to the decoding loop for a next iteration. Determining the next context probability for a next encoded binary element may include advancing a state of a finite state machine configured to provide a context for determination of the next context probability. Instructions for the finite state machine may be stored in an instruction cache of a processor. Additionally, a lookup table may be used by looking up the next context probability in the lookup table using the decoded binary element and the state of the finite state machine. The lookup table may be stored in a data cache of a processor. In some implementations, a decoded binary string may be generated from a sequence of two or more previously decoded binary elements at and end state of the decoding loop. It should be understood that the two or more previously decoded binary elements may be all of the binary elements decoded from the encoded binary sequence. The decoding loop may be processed on a first processing thread and parsing a syntax of the decoded binary string and generating a decoded symbol from the parsed syntax may be performed on a second processing thread. In other implementation, the decoding loop may be processed on a first processor core and parsing a syntax of the decoded binary string and generating a decoded symbol from the parsed syntax may be performed on a second processor core. In yet other implementations, the decoding loop may be processed on a processor and parsing a syntax of the decoded binary string and generating a decoded symbol from the parsed syntax may be performed on a Graphics processing unit. The improved method for decoding CABAC encoded media may include a plurality of syntax parsers operating in parallel, parsing a syntax of the decoded binary string and generating a decoded symbol from the parsed syntax. The improved method for decoding CABAC encoded media may further include decoding binary elements for encoded discrete cosine transform coefficients, motion vectors or block prediction modes.

Figure 4:
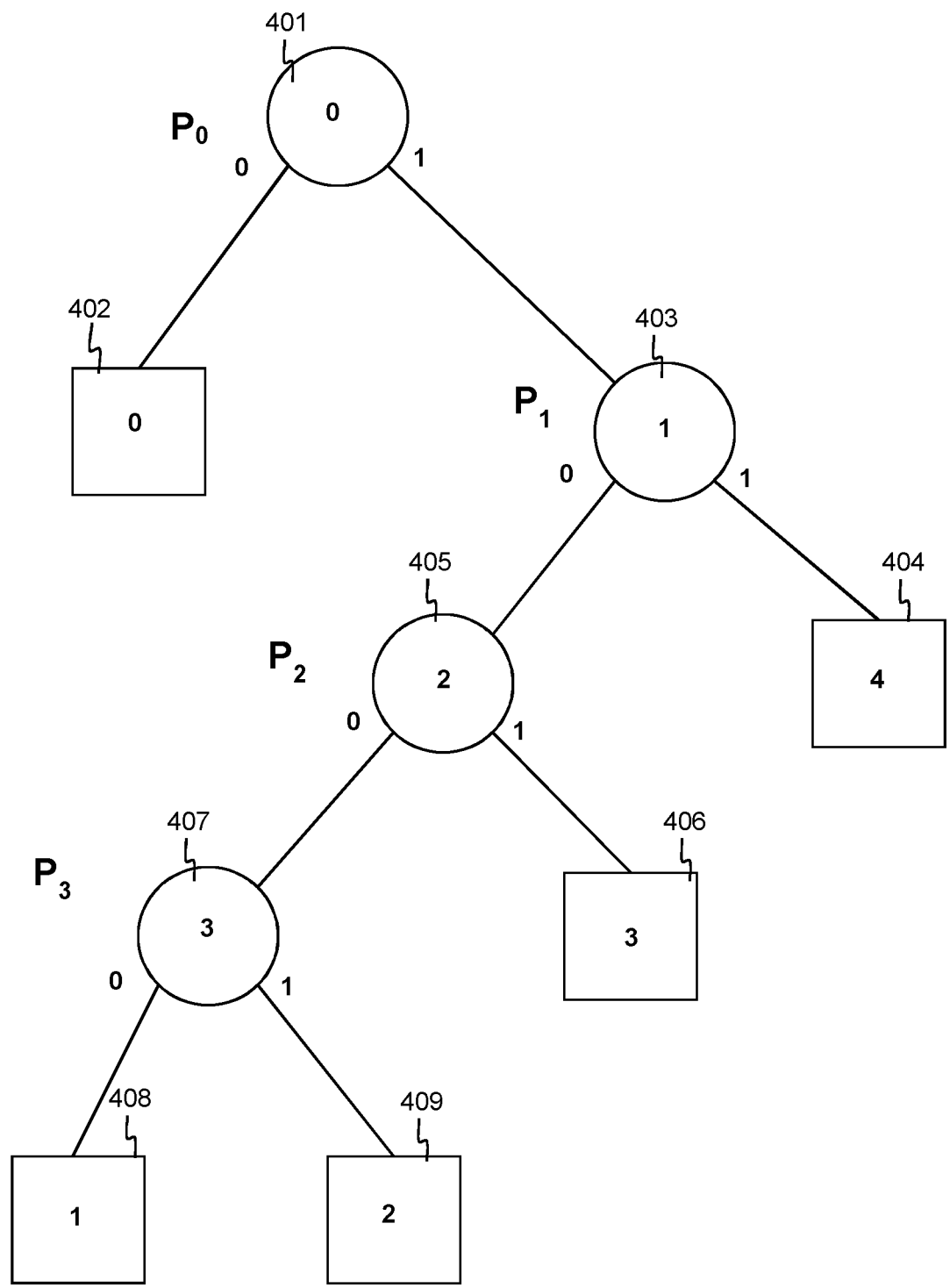
FIG. 4 is a tree diagram depicting an implementation of a state machine as a binary decision tree for decoding a CABAC encoded syntax element according to aspects of the present disclosure.

FIG. 4 shows an implementation of the finite state machine shown as a binary decision tree ending in a final symbol value determination. Each node in this binary decision tree represents a state of the state machine. The first state 401 has two binary options, which may have associated probabilities. If the bin value of the first state 401 is zero then the state machine advances to the end state with a symbol value of 0 402. If the bin value of the first state 401 is 1 then the state machine advances to the second state 403 and determines the second bin value. Similar to the first state, the second state has two options with associated context probabilities. If the second state 403 binary value is determined to be 1 then the state machine advances to an end state with a symbol value of 4 404. If the value is determined to be 0 then the state machine advances to the third state 405 and determines the third bin value. As above, a context probability may be used to determine the state value and if the value is 1, the state advances to an end state and the symbol value is determined to be 3 406. If the value is determined to be 0 then the state is advanced to the fourth state 407 and the binary value is determined as before. Here, the fourth state is an end state and therefore both bin values provide an end symbol value. If the binary value is 0 then the symbol value is determined to be 1 408 and if the binary value is 1 then end symbol value is 2 409. A state represents a bin value that may be assembled to reach a final value. For example, for the symbol value of 3 the binary of 101 is generated by processing through the state tree.

TABLE 1

State machine lookup table to decode a 5-values symbol.

| The current state | The current bin value | Next state | The probability of the next bin is 0. |
|---|---|---|---|
| First-bin | 0 | End | The probability of the first bin of the next symbol |
|  | 1 | Second-bin | The probability of the second bin |
| Second-bin | 0 | Third-bin | The probability of the third bin |
|  | 1 | End | The probability of the first bin of the next symbol |
| Third-bin | 0 | Fourth-bin | The probability of the fourth bin |
|  | 1 | End | The probability of the first bin of the next symbol |

TABLE 1-continued

State machine lookup table to decode a 5-values symbol.

| The current state | The current bin value | Next state | The probability of the next bin is 0. |
|---|---|---|---|
| Fourth-bin | 0 | End | The probability of the first bin of the next symbol |
| | 1 | End | The probability of the first bin of the next symbol |

Table 1 above depicts an example of a state machine such as depicted in FIG. 4, as a lookup table. The first column of Table 1 represents the current state of the state machine. The state tracks the context without needing to fully decode the symbol. When the binary value of the current state is determined, the table may be used to determine the next state and probability of the next state. For example, if the first binary value is 1 the state machine advances to the second bin as shown in the next state column and the probability that the next bin is 0 is provided in the final column. This probability is provided to the CABAC decoding engine to determine the value bin used in the table. Thus, the state machine may include a table similar to the one shown in Table 1 to aid in context probability determination.

For each symbol to be decoded another context table, such as Table 1, and another state machine may be required, as the context dependent nature of decoding symbols means that context probabilities differ between symbols. In some implementations, the number of tables may be reduced by replacing only some data in the tables for certain symbols. For example and without limitation, some symbol context probabilities may be nearly identical and their tables may only differ by a few entries. Instead of loading an entire new table into the data cache to process the nearly identical table, only the entries that differ for the symbol may be changed in the already loaded table. Thus, reducing cycles required to flush the data buffer and write a new table.

Figure 6:
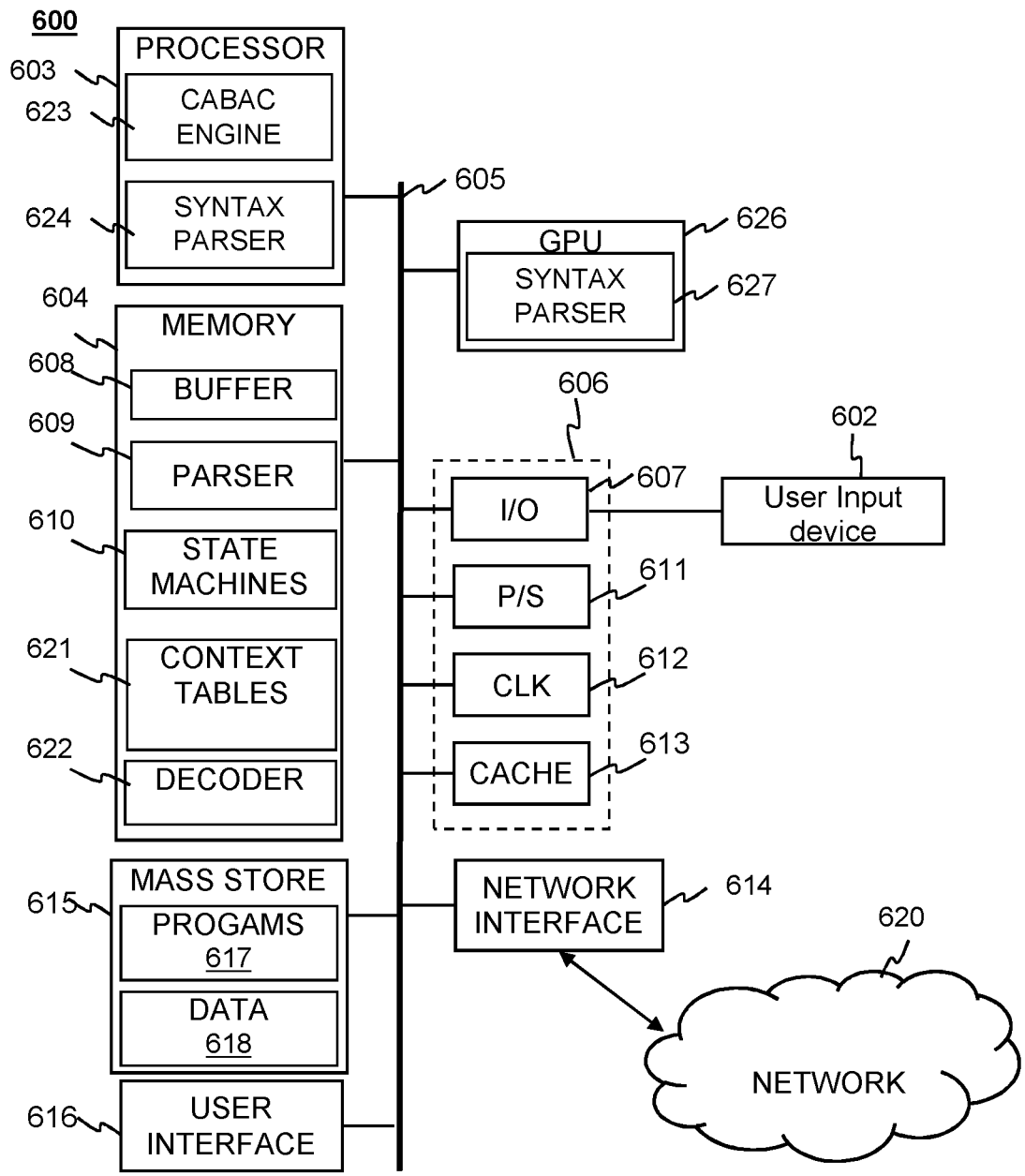
FIG. 6 is a block diagram illustrating an example of a computer system configured to operate in accordance with aspects of the present disclosure

FIG. 6 illustrates a block diagram of a computer system 600 that may be used to implement video coding according to aspects of the present disclosure. The system 600 generally may include a main processor 603, a memory 604 and a Graphics Processing Unit (GPU) 626 in communication via a main bus 605. The processor 603 may include one or more processor cores, e.g., single core, dual core, quad core, processor-coprocessor, Cell processor, architectures, and the like. Each core may include one or more processing threads that may process instructions in parallel with each other. The processor may include one or more integrated graphics cores, which may act as the GPU for the system.

In some implementations of the present disclosure processor 603 may run a CABAC engine 623 and syntax parser 624. The CABAC engine 623 may include state machine instructions small enough in data size to fit in an instruction cache of the processor 603. The CABAC engine 623 may also include one or more context tables for converting CABAC decoded binary syntax elements and a state from the state machine to a context probability for the next encoded binary syntax element. For example and without limitation two lookup operations to determine a context probability, the first operation determines a context from the state of the machine state and the second lookup determines the bin context probability from the context. The context table may be small enough in data size to fit into a data cache such as for example a level 1 data cache, a level 2 cache or a level 3 cache. The syntax parser 624 may run on a separate thread than the CABAC engine 623. For example, the CABAC engine may run on a first thread and the syntax parser 624 may run in parallel on a second thread. Alternatively, the syntax parser 624 may run on a separate core or on GPU core of the processor 603. The syntax parser may parse the syntax or grammar of the decoded binary string and generate a decoded syntax element or symbol. In some implementations, syntax parser 627 may be loaded from memory onto a graphics processing unit (GPU) 626. The syntax parser 627 may receive a decoded binary string from the CABAC engine 623 running on the processor 603.

The memory 604 may be in the form of an integrated circuit, e.g., RAM, DRAM, ROM, and the like. The memory may also be a main memory that is accessible by all of the processor cores in the processor 603. In some embodiments, the processor 603 may have local memories associated with one or more processor cores or one or more co-processors. A decoder program 622 may be stored in the memory 604 in the form of processor readable instructions that can be executed on the processor 603. The decoder program 622 may be configured to decode a CABAC encoded signal data into decoded pictures e.g., as described above. The decoder program 622 may orchestrate the operation of a CABAC engine 623, and a syntax parser 624. The CABAC engine 623 may take CABAC encoded binary elements and generate decoded binary elements. The CABAC engine 623 creates a two or more of the decoded binary elements i.e. a decoded binary string that is to be parsed into a symbol or symbols by a syntax parser. The CABAC engine 623 may include a state machine loaded into the instruction cache of the processor 603 from memory 604. The state machine may be one of many state machines 610 stored in memory 604 until the appropriate symbol for the state machine is to be decoded, at which time instructions for the appropriate state machine are loaded into the instruction cache of the processor 603. The CABAC engine may also include a context table loaded into a data cache of the processor 603 from memory 604. The context table may be one of many context tables 621 stored in memory 604. Each symbol may have an associated context table for decoding the encoded binary syntax element related to that symbol using states from the state machine and currently decoded binary syntax elements as discussed above. The memory 604 may also contain syntax parser programs 609, which convert decoded binary strings into decoded symbols. The syntax parser programs 609 may be carried out by the processor 603 and at least a portion of the syntax parser 609 may be loaded into the instruction and/or data cache of the processor 603 from memory 604. In implementations having a syntax parser running on the GPU 627, the syntax parser 627 may receive decoded binary syntax elements from the CABAC engine 623 running on the processor 603 or stored in a buffer 608 in memory 604. The buffer 608 may store encoded data or other data generated or received during the decoding process in the memory 604.

The system 600 may also include well-known support functions 606, such as input/output (I/O) elements 607, power supplies (P/S) 611, a clock (CLK) 612 and cache 613. The system 600 may optionally include a mass storage device 615 such as a disk drive, CD-ROM drive, tape drive, or the like to store programs 617 and/or data 618. The decoder program 622 and syntax parser 609 may be stored as programs 617 on the mass storage device 615. Context tables 621, state machines 610 and buffered data may also be stored as data 618 in the mass storage device 615. The device 600 may also optionally include a user interface 616 and user input device 602 to facilitate interaction between the system 600 and a user. The user interface 616 may be in the form of a cathode ray tube (CRT) or flat panel screen that displays text, numerals, graphical symbols, or images. The user input device 602 may include a keyboard, mouse, joystick, light pen, or other device that may be used in conjunction with a graphical user interface (GUI). The system 600 may also include a network interface 614 to enable the device to communicate with other devices over a network 620, such as the internet. The system 600 may receive one or more frames of encoded streaming data (e.g., one or more encoded video frames) from other devices connected to the network 620 via the network interface 614. These components may be implemented in hardware, software, or firmware, or some combination of two or more of these.

While the above is a complete description of the preferred embodiment of the present invention, it is possible to use various alternatives, modifications, and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for decoding CABAC encoded media, comprising a decoding loop including:
    decoding an encoded binary element from a sequence of encoded binary elements to generate a decoded binary element using a context probability;
    determining a next context probability for a next encoded binary element in the sequence from the decoded binary element;
    providing the next context probability for decoding the next encoded binary element to the decoding loop for a next iteration wherein the decoding loop is processed on a first processing thread;
    outputting a decoded binary string from two or more previously decoded elements at an end state for the decoding loop and parsing a syntax of the decoded binary string; and
    generating a decoded symbol from the parsed syntax on a second processing thread.

2. The method of claim 1 wherein determining the next context probability for a next encoded binary element includes advancing a state of a finite state machine configured to provide a context for determination of the next context probability.

3. The method of claim 2, wherein the decoding loop further comprises looking up the next context probability in a lookup table using the decoded binary element and the state of the finite state machine.

4. The method of claim 3 wherein the lookup table is stored in a data cache of a processor.

5. The method of claim 1 wherein the decoding loop is processed on a first processor core.

6. The method of claim 5, wherein the second processing thread is running on a second processor core.

7. The method of claim 5, wherein the second processing thread is running on a graphics processing unit.

8. The method of claim 1, further comprising decoding a binary string for encoded discrete cosine transform coefficients, motion vectors or block prediction modes.

9. The method of claim 1, further comprising running a plurality syntax parsers in parallel.

10. The method of claim 2 wherein instructions for the finite state machine are stored in an instruction cache of a processor.

11. A system for decoding CABAC encoded media, comprising:
    a processor;
    a memory coupled to the processor;
    processor executable instruction embodied in the memory the instruction being configured to implement a method for decoding CABAC encoded media, comprising a decoding loop including:
        decoding an encoded binary element from a sequence of encoded binary elements to generate a decoded binary element using a context probability;
        determining a next context probability for a next encoded binary element in the sequence from the decoded binary element;
        providing the next context probability for decoding the next encoded binary element to the decoding loop for a next iteration wherein the decoding loop is processed on a first processing thread;
    outputting a decoded binary string from two or more previously decoded elements at an end state for the decoding loop and parsing a syntax of the decoded binary string; and
    generating a decoded symbol from the parsed syntax on a second processing thread.

12. The system of claim 11 wherein determining the next context probability for a next encoded binary element includes advancing a state of a finite state machine configured to provide a context for determination of the next context probability.

13. The system of claim 12, wherein the decoding loop further comprises looking up the next context probability in a lookup table using the decoded binary element and the state of the finite state machine.

14. The system of claim 13 wherein the lookup table is stored in a data cache of the processor.

15. The system of claim 13, further comprising a syntax parser configured to parse the syntax of the decoded binary string and generate the decoded symbol from the parsed syntax on the second processing thread of the processor.

16. The system of claim 11 wherein the decoding loop is processed on a first processing core of the processor.

17. The system of claim 16, further comprising a syntax parser configured to parse the syntax of the decoded binary string and generate the decoded symbol from the parsed syntax on a second processing core of the processor.

18. The system of claim 11 further comprising a graphics processing unit having a syntax parser configured to parse a syntax of the decoded binary string and generate the decoded symbol from the parsed syntax on the graphics processing.

19. The system of claim 11, wherein the method further comprises decoding a binary string for encoded discrete cosine transform coefficients, motion vectors or block prediction modes.

20. The system of claim 11 further comprising a plurality syntax parsers running in parallel.

21. The system of claim 12 wherein instructions for the finite state machine are stored in an instruction cache of the processor.

22. A non-transitory computer readable medium having computer readable instruction embodied thereon, the instructions being configured to implement the method for decoding of CABAC encoded media upon execution by a computer, the method comprising, a decoding loop including:

decoding an encoded binary element from a sequence of encoded binary elements to generate a decoded binary element using a context probability;

determining a next context probability for a next encoded binary element in the sequence from the decoded binary element;

providing the next context probability for decoding the next encoded binary element to the decoding loop for a next iteration wherein the decoding loop is processed on a first processing thread;

outputting a decoded binary string from two or more previously decoded elements at an end state for the decoding loop and parsing a syntax of the decoded binary string; and generating a decoded symbol from the parsed syntax on a second processing thread.

\* \* \* \* \*